United States Patent
Liu et al.

(10) Patent No.: US 6,558,739 B1
(45) Date of Patent: *May 6, 2003

(54) TITANIUM NITRIDE/TITANIUM TUNGSTEN ALLOY COMPOSITE BARRIER LAYER FOR INTEGRATED CIRCUITS

(75) Inventors: Erzhuang Liu, Singapore (SG); Charles Lin, Singapore (SG); Yih-Shung Lin, Singapore (SG)

(73) Assignee: Chartered Semiconductor Manufacturing Ltd., Singapore (SG)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 823 days.

(21) Appl. No.: 08/866,773

(22) Filed: May 30, 1997

(51) Int. Cl.[7] .................. B05D 5/12; H01L 21/4763
(52) U.S. Cl. .................. 427/97; 427/123; 427/377; 427/383.1; 438/627; 438/643; 438/653; 438/655; 438/660; 438/681
(58) Field of Search .................. 427/96, 123, 377, 427/383.1, 97; 438/627, 643, 653, 655, 660, 681

(56) References Cited

U.S. PATENT DOCUMENTS

| | | | |
|---|---|---|---|
| 5,049,975 A | * 9/1991 | Ajika et al. | 357/71 |
| 5,312,774 A | * 5/1994 | Nakamura et al. | 437/192 |
| 5,378,660 A | 1/1995 | Ngan et al. | 437/247 |
| 5,380,678 A | * 1/1995 | Yu et al. | 437/190 |
| 5,381,807 A | * 1/1995 | Lee | 134/2 |
| 5,504,043 A | 4/1996 | Ngan et al. | 437/247 |
| 5,508,212 A | 4/1996 | Wang et al. | 437/24 |

* cited by examiner

Primary Examiner—Brian K. Talbot
(74) Attorney, Agent, or Firm—George O. Saile; Rosemary L. S. Pike

(57) ABSTRACT

A method for forming a barrier layer upon an electrode contact. There is first provided a silicon substrate layer having an electrode contact region formed within the silicon substrate layer. There is then formed over the silicon substrate layer a titanium layer, where the titanium layer contacts the electrode contact region of the silicon substrate layer. There is then processed thermally the titanium layer in a nitrogen containing atmosphere to form a titanium silicide layer in contact with the electrode contact region and a titanium nitride layer formed thereover, where the titanium layer is completely consumed in forming the titanium silicide layer and the titanium nitride layer. Finally, there is formed upon the titanium nitride layer a barrier layer.

12 Claims, 3 Drawing Sheets

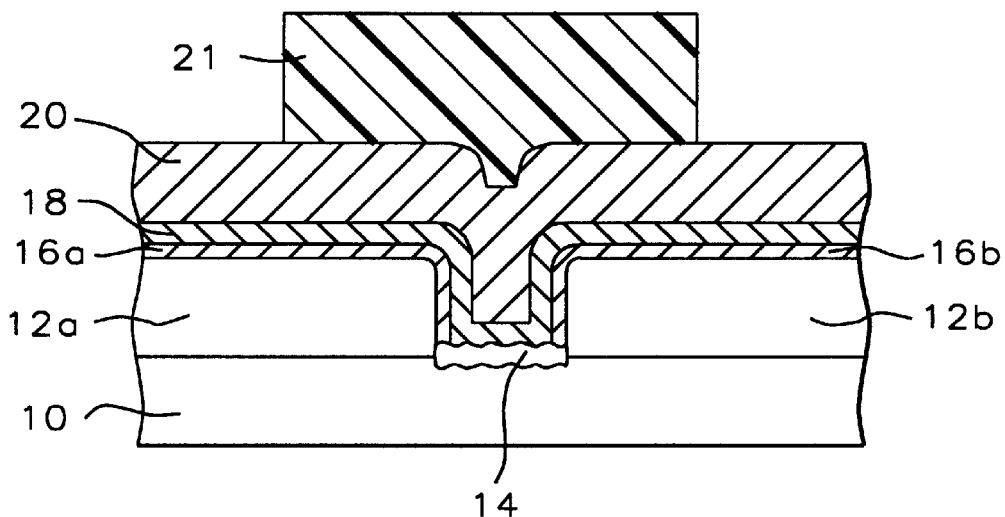
*FIG. 1 - Prior Art*
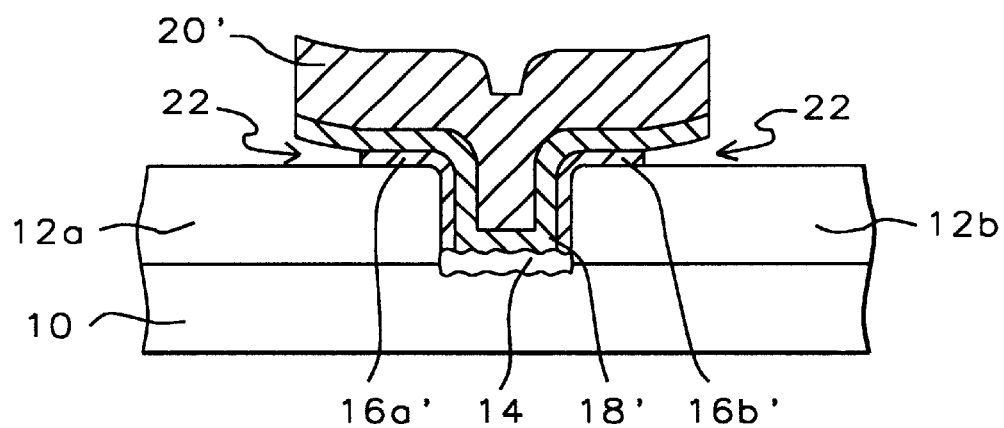
*FIG. 2 - Prior Art*

TITANIUM NITRIDE/TITANIUM TUNGSTEN ALLOY COMPOSITE BARRIER LAYER FOR INTEGRATED CIRCUITS

BACKGROUND OF THE INVENTION

1. Field of the Invention

The present invention relates generally to barrier layers within integrated circuits. More particularly, the present invention relates to composite barrier layers within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

In the process of forming within integrated circuits patterned conductor layers for connecting and interconnecting electrical circuit elements formed within and upon semiconductor substrates, it is common in the art to employ a barrier layer formed interposed between an electrode contact of an electrical circuit element and a conductor layer, typically an aluminum containing conductor layer, desired to be formed contacting the electrode contact of the electrical circuit element. Such barrier layers provide a barrier to: (1) inhomogeneous inter-diffusion of the electrode contact with the conductor layer; and/or (2) spiking of the conductor layer (when the conductor layer is formed from an aluminum containing conductor material) into the electrode contact. When an electrode contact is formed from a silicon containing material to yield a silicon containing electrode contact, as is most common in the art, there is typically also employed a metal silicide layer formed upon the electrode contact, typically through annealing a metal silicide forming metal layer in contact with the silicon containing electrode contact, in order to provide a low resistance connection to the electrical circuit element.

A typical electrical circuit element electrode contact employing such a barrier layer and a metal silicide layer (formed from a metal silicide forming metal layer) is illustrated by the schematic cross-sectional diagram of FIG. 1. Shown in FIG. 1 is a silicon semiconductor substrate 10 having formed upon its surface a pair of patterned dielectric layers 12a and 12b which define a window accessing the silicon semiconductor substrate 10. Formed through partial consumption of a blanket metal silicide forming metal layer (not shown) formed in contact with the portion of the silicon semiconductor substrate 10 exposed within the window is a metal silicide layer 14, along with a pair of metal silicide forming metal layer residues 16a and 16b. There is also shown formed upon the metal silicide forming metal layer residues 16a and 16b, and the metal silicide layer 14, a blanket barrier layer 18. Finally, there is shown in FIG. 1 a blanket conductor layer 20 formed upon the blanket barrier layer 18, where the blanket conductor layer 20 has formed thereupon a patterned photoresist layer 21. Within the electrical circuit element electrode contact structure whose schematic cross-sectional diagram is illustrated in FIG. 1, the metal silicide layer 14 is typically, although not exclusively, a titanium silicide layer, while the metal silicide forming metal layer residues 16a and 16b are thus typically, although not exclusively, titanium metal layer residues. In addition, the blanket barrier layer 18 is typically a blanket titanium-tungsten alloy barrier layer since titanium-tungsten alloy barrier layers typically have superior step coverage within narrow high aspect ratio apertures. Further, as is most common in the art, the blanket conductor layer 20 is typically a blanket aluminum containing conductor layer. Finally, the patterned photoresist layer 21 is formed of a photoresist material which is susceptible to stripping within a photoresist stripping/polymer removal composition which employs a hydroxyl/amine compound such as but not limited to hydroxylamine (ie: $NH_2OH$; (HDA)) and bis (2-aminoethoxy)-2-ethanol (ie: $(NH_2CH_2CH_2O)_2CHCH_2OH$; (DGA)).

While the electrical circuit element electrode contact structure whose schematic cross-sectional diagram is illustrated in FIG. 1 has become quite common in the art of integrated circuit fabrication, the electrical circuit element electrode contact structure whose schematic cross-sectional diagram is illustrated in FIG. 1 is not entirely without problems. In particular, when patterning the electrical circuit element electrode contact structure whose schematic cross-sectional diagram is illustrated in FIG. 1 to form a patterned electrical circuit element electrode contact structure there is often observed partial delamination of a patterned barrier layer from the patterned dielectric layers 12a and 12b when the metal silicide forming metal layer residues 16a and 16b are formed of titanium. A schematic cross-sectional diagram illustrating the mechanism through which such partial delamination occurs is illustrated in FIG. 2.

Shown in FIG. 2 is a patterned conductor layer 20' formed upon a patterned barrier layer 18', where the patterned conductor layer 20' is patterned from the blanket conductor layer 20 and the patterned barrier layer 18' is successively patterned from the blanket barrier layer 18. Also shown in FIG. 2 is a pair of voids 22 where the patterned barrier layer 18' and the patterned conductor layer 20' have delaminated from the patterned dielectric layers 12a and 12b. Such delamination typically occurs due to etching and undercutting of a pair of patterned metal silicide forming metal layer residues formed of titanium (not shown) successively patterned from the metal silicide forming metal layer residues 16a and 16b, where the etching and undercutting occurs due to contact of the patterned metal silicide forming metal layer residues with a stripping composition employed in removing from the surface of the electrode contact structure whose schematic cross-sectional diagram is illustrated in FIG. 2 a patterned photoresist layer employed in defining the patterned conductor layer 20', the patterned barrier layer 18' and the patterned metal silicide forming metal layer residues. In particular, when the metal silicide forming metal layer residues 16a and 16b are formed of titanium, photoresist stripping/polymer removal compositions which employ hydroxyl/amine compounds such as but not limited to hydroxylamine (ie: $NH_2OH$; (HDA)) and bis (2-aminoethoxy-2-ethanol) (ie: $(N_2CH_2CH_2O)_2CHCH_2OH$; (DGA)) may be particularly efficient in etching patterned titanium metal silicide forming metal layers residues to provide the undercutting and void 22 formation as illustrated in FIG. 2.

It is therefore desirable in the art to provide methods for forming electrical circuit element contact structures such that the contact structures are not susceptible to delamination from surfaces of substrates upon which are formed those contact structures, due to etching with stripper solutions of metal silicide forming metal layers formed within those structures, that the present invention is generally directed.

Novel barrier layer constructions which provide improved properties to integrated circuits are know within the art of integrated circuit fabrication. For example, Ngan et al. in U.S. Pat. No. 5,378,660 and U.S. Pat. No. 5,504,043 disclose a titanium nitride barrier layer construction with improved diffusion barrier properties for aluminum layers formed at elevated temperatures upon the titanium nitride barrier layer construction. The titanium nitride barrier layer within the titanium nitride barrier layer construction has incorporated therein additional oxygen. In addition, Wang et al., in U.S. Pat. No. 5,508,212 disclose a large tilt angle method for forming a titanium nitride layer which limits encroaching of titanium silicide layers within a field effect transistor within an integrated circuit.

Desirable in the art are additional methods for forming barrier layers within integrated circuits. Particularly desirable are additional methods through which there may be formed barrier layers upon low contact resistance metal silicide layers within integrated circuits, where a metal silicide forming metal layer residue, most preferably a titanium layer residue, formed beneath the barrier layer is not susceptible to dissolution, thus yielding delamination of the barrier layer from an electrode contact within the integrated circuit. It is towards these goals that the present invention is more specifically directed.

SUMMARY OF THE INVENTION

A first object of the present invention is to provide a barrier layer for use upon an electrode contact within an integrated circuit.

A second object of the present invention is to provide a barrier layer in accord with the first object of the present invention, where the barrier layer when formed upon a low contact resistance metal silicide layer formed upon the electrode contact has limited susceptibility to delamination due to dissolution of metal silicide forming metal layer residues formed beneath the barrier layer.

In accord with the objects of the present invention, there is provided a barrier layer for use upon an electrode contact within an integrated circuit. To form the barrier layer of the present invention, there is first provided a silicon substrate layer having an electrode contact region formed within the silicon substrate layer. There is then formed over the silicon substrate layer a titanium layer, where the titanium layer contacts the electrode contact region of the silicon substrate layer. The titanium layer is then processed thermally in a nitrogen containing atmosphere to form a titanium silicide layer in contact with the electrode contact region and a titanium nitride layer formed thereover. The titanium layer is completely consumed informing the titanium silicide layer and the titanium nitride layer. Finally, there is formed upon the titanium nitride layer a barrier layer.

There is provided by the present invention a barrier layer for use as an electrode contact within an integrated circuit, where the barrier layer when formed upon a low contact resistance metal silicide layer has limited susceptibility to delamination due to dissolution of metal silicide forming metal layer residues formed beneath the barrier layer. The barrier layer formed through the method of the present invention has limited susceptibility to delamination since the titanium layer employed in forming a titanium silicide layer upon an electrode contact beneath the barrier layer is completely consumed in forming either the titanium silicide layer or a titanium nitride layer. Since there remains no titanium metal which may be undercut beneath the barrier layer, the barrier layer has limited susceptibility to delamination.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 and FIG. 2 show a pair of schematic cross-sectional diagrams illustrating delamination of a barrier layer formed upon an electrode contact through a method conventional in the art of integrated circuit fabrication.

DESCRIPTION OF THE PREFERRED EMBODIMENT

The present invention provides a method for forming upon an electrode contact of an electrical circuit element within an integrated circuit a barrier layer, where the barrier layer is formed upon a low contact resistance metal silicide layer formed upon the electrode contact and where the barrier layer has limited susceptibility to delamination due to dissolution of metal silicide forming metal layer residues formed beneath the barrier layer. The present invention achieves this goal through forming and thermally annealing a titanium layer upon the electrode contact in the presence of a nitrogen containing atmosphere to form a titanium silicide layer upon the electrode contact and a titanium nitride layer thereover, where the titanium layer is completely consumed in forming the titanium silicide layer and the titanium nitride layer. Since the titanium layer is completely consumed in forming the titanium silicide layer and the titanium nitride layer, a barrier layer formed upon the titanium nitride layer and the titanium silicide layer is not susceptible to delamination due to undercutting and dissolution of titanium metal silicide forming metal layer residues.

Figure 3:
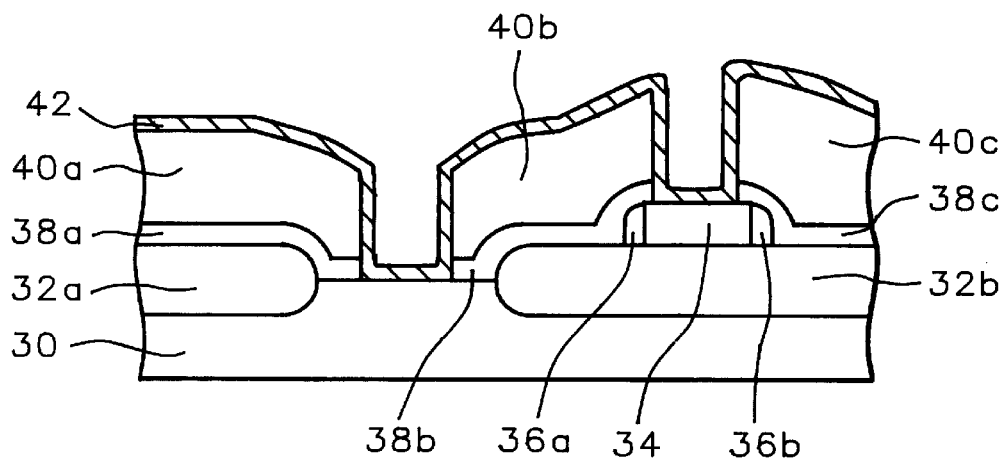
FIG. 3, FIG. 4, FIG. 5 and FIG. 6 show a series of schematic cross-sectional diagrams illustrating the results of forming a barrier layer upon an electrode contact through the preferred embodiment of the method of the present invention.

Referring now to FIG. 3 to FIG. 6, there is shown a series of schematic cross-sectional diagrams illustrating the results of progressive stages in forming upon an electrode contact within an integrated circuit a barrier layer in accord with the preferred embodiment of the present invention. Shown in FIG. 3 is a schematic cross-sectional diagram of the integrated circuit at an early stage in its formation.

Shown in FIG. 3 is a semiconductor substrate 30 having formed within and upon its surface a pair of isolation regions which define an active region of the semiconductor substrate 30. Although semiconductor substrates are known in the art with either dopant polarity, various dopant concentrations and several crystallographic orientations, for the preferred embodiment of the present invention the semiconductor substrate 30 is preferably a (100) silicon semiconductor substrate having an N- or P-doping. Similarly, although it is also known in the art that isolation regions may be formed within and/or upon semiconductor substrates to define active regions of those semiconductor substrates through methods including but not limited to isolation region thermal growth methods and isolation region deposition/patterning methods, for the preferred embodiment of the method of the present invention the isolation regions 32*a* and 32*b* are preferably formed within and upon the semiconductor substrate 30 through an isolation region thermal growth method, as is conventional in the art.

Also shown in FIG. 3 formed upon the isolation region 32*b* is a polysilicon interconnect 34 having formed upon its edges a pair of insulator spacers 36*a* and 36*b*. Both the polysilicon interconnect 34 and the pair of insulator spacers 36a and 36b may be formed through methods as are conventional in the art. Typically, the polysilicon interconnect 34 is formed through patterning, through methods as are conventional in the art, of a blanket polysilicon layer deposited through methods as are conventional in the art, while the insulator spacers 36a and 36b are formed through anisotropic etching of a conformal insulator layer formed upon the polysilicon interconnect 34. Preferably the polysilicon interconnect 34 is from about 1500 to about 6000 angstroms thick, with a resistivity of from about 15 to about 60 ohms per square.

There is also shown in FIG. 3 the presence of a series of patterned conformal dielectric layers 38a, 38b, and 38c having formed and aligned thereupon a series of patterned premetal dielectric (PMD) layers 40a, 40b and 40c. The patterned conformal dielectric layers 38a, 38b and 38c, and the patterned pre-metal dielectric (PMD) layers 40a, 40b and 40c may also be formed through methods as are conventional in the art. Preferably, the patterned conformal dielectric layers 38a, 38b and 38c are formed through patterning, through methods as are conventional in the art, of a blanket conformal dielectric layer formed through a plasma enhanced chemical vapor deposition (PECVD) method employing a suitable silicon source material to yield patterned conformal dielectric layers 38a, 38b and 38c of silicon oxide at a thickness of from about 400 to about 1500 angstroms thick each. Similarly, the patterned pre-metal dielectric layers 40a, 40b and 40c are preferably formed through patterning, through methods as are conventional in the art, of a blanket pre-metal dielectric (PMD) layer formed of a glass such as a boro-silicate glass (BSG), phospho-silicate glass (PSG) or a boro-phospho-silicate glass (BPSG) formed through a chemical vapor deposition (CVD) method or a plasma enhanced chemical vapor deposition (PECVD) method at a thickness of from about 4000 to about 12000 angstroms. Other methods and materials may, however, be employed in forming the patterned conformal dielectric layers 38a, 38b and 38c, and the patterned pre-metal dielectric (PMD) layers 40a, 40b and 40c.

The patterned conformal dielectric layers 38a, 38b and 38c, and the patterned premetal dielectric (PMD) layers 40a, 40b and 40c define a pair of apertures, a first one of which accesses the surface of the active region of the semiconductor substrate 30 and the second of which accesses the polysilicon interconnect 34. Although FIG. 3 illustrates the first aperture as accessing an active region of the semiconductor substrate 30 to form an electrode contact, it is understood by a person skilled in the art that the electrode contact to the semiconductor substrate 30 may be an electrode contact to an electrical circuit element formed within the semiconductor substrate 30 such as, but not limited to a transistor (ie: field effect transistor (FET), bipolar transistor or other transistor) electrode contact, a diode electrode contact or a resistor electrode contact, for a transistor, diode or resistor formed within the semiconductor substrate 30. Similarly, while FIG. 3 illustrates the second aperture as accessing the polysilicon interconnect 34 formed upon the isolation region 32b, it is also understood by a person skilled in the art that the second aperture may also be formed to access electrode contacts of other electrical circuit elements formed upon the isolation region 32b. Such other electrical circuit elements may include, but are not limited to polysilicon resistors and polysilicon capacitors. As is further understood by a person skilled in the art, the method of the present invention provides optimal value in forming a barrier layer within the integrated circuit whose schematic cross-sectional diagram is illustrated in FIG. 3 when at least one of the first aperture and the second aperture accesses a silicon containing surface. As is illustrated in FIG. 3 at least one of the first aperture and the second aperture will typically, although not exclusively, access a silicon substrate (ie: monocrystalline silicon) surface or a polysilicon substrate surface.

Finally, there is shown in FIG. 3 the presence of a blanket titanium layer 42. The blanket titanium layer 42 may be formed through methods as are conventional in the art, including but not limited to thermally assisted evaporation methods, electron beam assisted evaporation methods, chemical vapor deposition (CVD) methods and physical vapor deposition (PVD) sputtering methods. Preferably, although not exclusively, the blanket titanium layer 42 is formed through a physical vapor deposition (PVD) sputtering method to form the blanket titanium layer 42 of from about 200 to about 1200 angstroms thickness.

Figure 4:
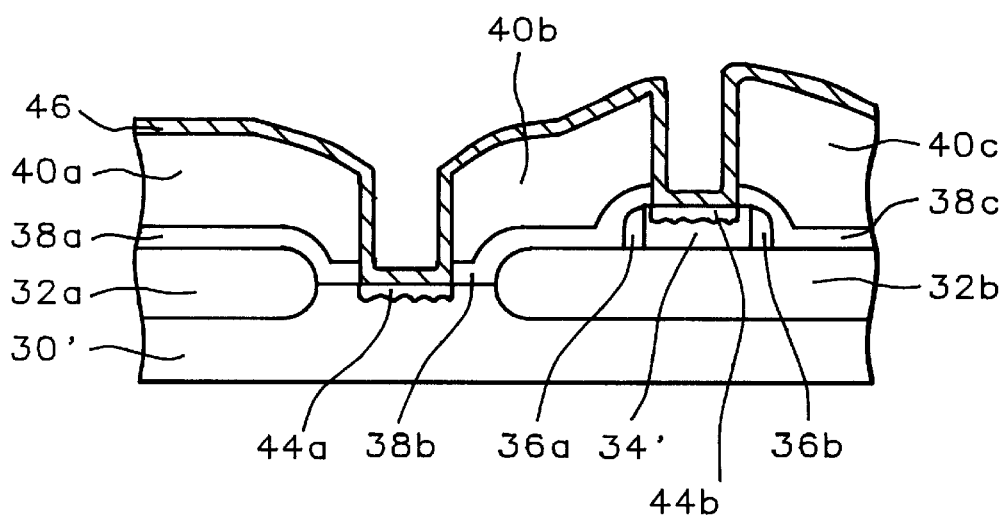

Referring now to FIG. 4, there is shown a schematic cross-sectional diagram illustrating the results of further processing of the integrated circuit whose schematic cross-sectional diagram is illustrated in FIG. 3. Shown in FIG. 4 is the results of thermally annealing the blanket titanium layer 42 within a nitrogen containing atmosphere to form a pair of titanium silicide layers 44a and 44b and a blanket titanium nitride layer 46 formed thereupon. In the thermal annealing process for forming the titanium silicide layers 44a and 44b the semiconductor substrate 30 and the polysilicon interconnect 34 are partially consumed to form a partially consumed semiconductor substrate 30' and a partially consumed polysilicon interconnect 34'.

The blanket titanium layer 42 may be thermally annealed within any of several nitrogen containing atmospheres to form the blanket titanium nitride layer 46 and the titanium silicide layers 44a and 44b. Such nitrogen containing atmospheres include but are not limited to nitrogen gas atmospheres and ammonia gas atmospheres. In addition, the thermal annealing may be provided by any of several methods as are known in the art, including but not limited to a conventional thermal processing within a furnace, rapid thermal processing (RTP) methods employing intense heat for relatively short time periods, thermal processing within a plasma environment and thermo-optical processing employing intense light sources of appropriate wavelength for absorption and dissipation as heat. For the preferred embodiment of the present invention, the blanket titanium layer 42 is preferably annealed to form the blanket titanium nitride layer 46 and the titanium silicide layers 44a and 44b through a rapid thermal processing (RTP) method at a temperature of from about 570 to about 925 degrees centigrade, although other methods may be employed in forming from the blanket titanium layer 42 the blanket titanium nitride layer 46 and the titanium silicide layers 44a and 44b. Within the method of the present invention, the blanket titanium layer 42 is thermally annealed for a time period sufficient to completely consume the blanket titanium layer 42 in forming the blanket titanium nitride layer 46 and the titanium silicide layers 44a and 44b.

Figure 5:
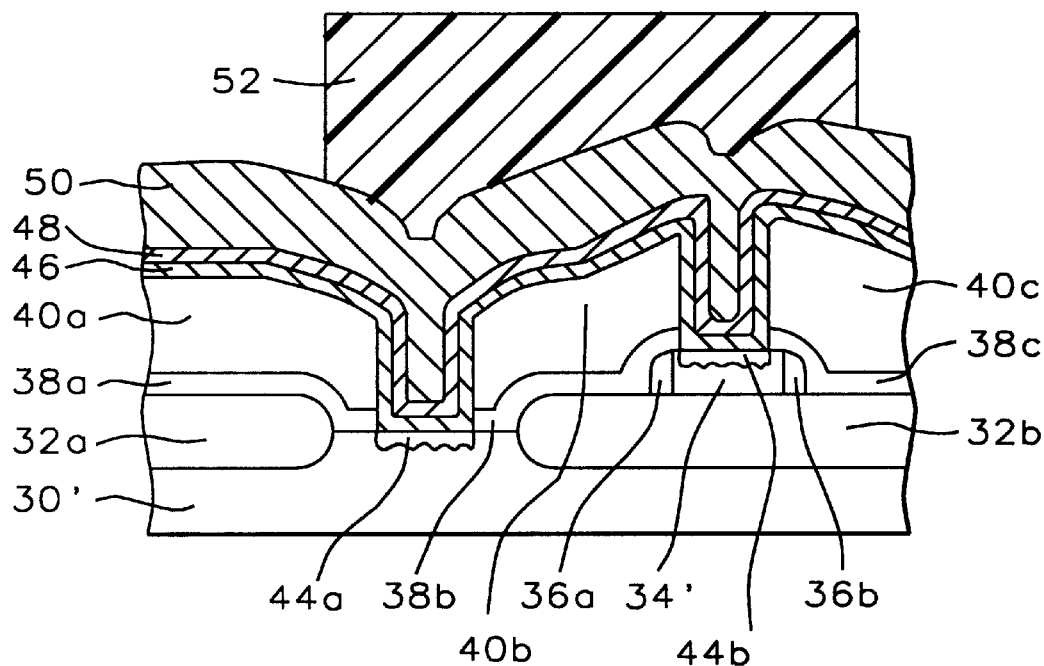

Referring now to FIG. 5, there is shown a schematic cross-sectional diagram illustrating the results of further processing of the integrated circuit whose schematic cross-sectional diagram is illustrated in FIG. 4. Shown in FIG. 5 is a schematic cross-sectional diagram of an integrated circuit otherwise equivalent to the integrated circuit whose schematic cross-sectional diagram is illustrated in FIG. 4, but upon whose surface there is formed a blanket barrier layer 48, a blanket conductor layer 50 and a patterned photoresist layer 52. The blanket barrier layer 48 and the blanket conductor layer 50 may be formed through methods and materials as are conventional in the art of integrated circuit fabrication, including but not limited to thermally assisted evaporation methods, electron beam assisted evaporation methods, chemical vapor deposition (CVD) methods and physical vapor deposition (PVD) sputtering methods through which may be formed: (1) barrier layers of barrier materials including but not limited to metals, metal alloys, metal nitrides and metal oxides; and (2) conductor layers of conductor materials including but not limited to metals and metal alloys. For the preferred embodiment of the method of the present invention, the blanket barrier layer 48 is preferably formed of a titanium-tungsten alloy deposited through a physical vapor deposition (PVD) sputtering method upon the blanket titanium nitride layer 46 to a thickness of from about 300 to about 1500 angstroms. The titanium-tungsten alloy is preferred, in part, due to its superior step coverage when forming blanket barrier layers within narrow high aspect ratio apertures. Amongst any of several other alternative, but not limiting, materials for forming the blanket barrier layer 48, there may alternatively be employed additional blanket layers of titanium nitride formed through methods which provide varying densities of the titanium nitride layers. With respect to the blanket conductor layer 50, the blanket conductor layer 50 is preferably formed of an aluminum containing conductor material, as is most conventional in the art, although other conductor materials, including but not limited to copper containing conductor materials, may also be employed in forming the blanket conductor layer 50. With respect to the patterned photoresist layer 52, the patterned photoresist layer 52 is formed of a photoresist material which is susceptible to stripping within a photoresist stripping/polymer removal composition which employs a hydroxyl/amine compound such as but not limited to hydroxylamine (ie: $NH_2OH$; (HDA) and bis (2-aminoethoxy)-2-ethanol (ie: $(NH_2CH_2CH_2O)_2CHCH_2OH$; (DGA)).

Figure 6:
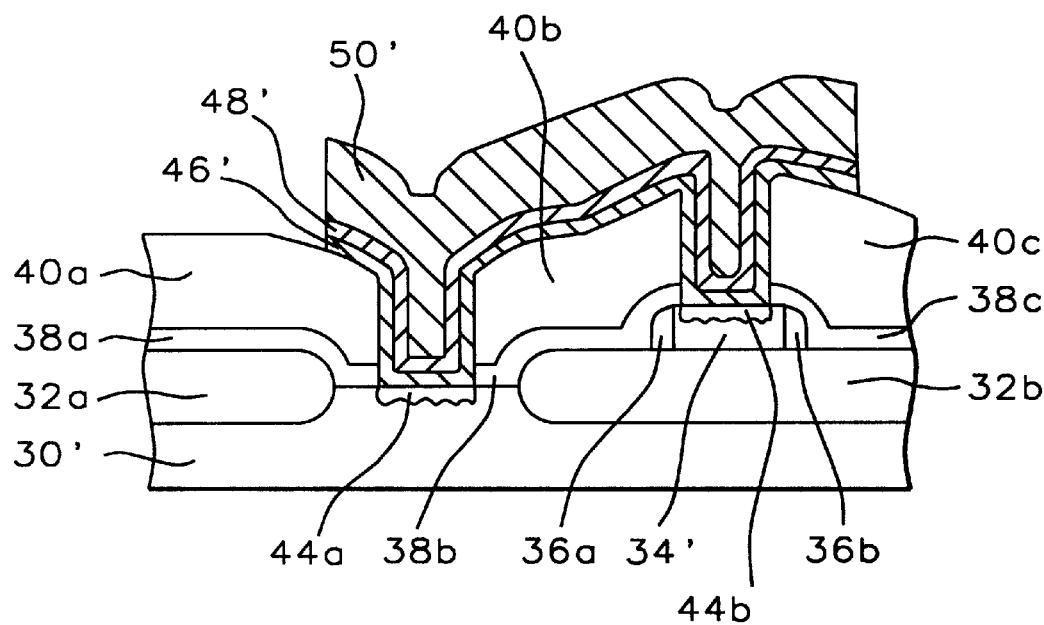

Referring now to FIG. 6, there is shown a schematic cross-sectional diagram illustrating the results of further processing of the integrated circuit whose schematic cross-sectional diagram is illustrated in FIG. 5. Shown in FIG. 6 is the results of patterning through a photolithographic method employing a stripping material which will dissolve a titanium layer and undercut a barrier layer, the blanket conductor layer 50, the blanket barrier layer 48 and the blanket titanium nitride layer 46 to form a patterned conductor layer 50', a patterned barrier layer 48' and a patterned titanium nitride layer 46'. Since through the method of the present invention the titanium layer 42 is completely consumed when forming the titanium nitride layer 46 and the titanium silicide layers 44a and 44b, there is formed through the method of the present invention a barrier layer which does not have a titanium layer formed there beneath. Thus, the patterned conductor layer 50' and the patterned barrier layer 48' of the present invention may be formed absent delamination from the integrated circuit whose schematic cross-sectional diagram is illustrated in FIG. 6 when there is removed from the surface of the integrated circuit whose schematic cross-sectional diagram is illustrated in FIG. 6, through a stripping method employing a photoresist stripping/polymer removal composition which employs a hydroxyl/amine compound such as but not limited to hydroxylamine (ie: $NH_2OH$; (HDA)) and bis (2-aminoethoxy)-2-ethanol (ie: $(NH_2CH_2CH_2O)_2CHCH_2OH$; (DGA)), the patterned photoresist layer 52 employed in defining the patterned conductor layer 50', the patterned barrier layer 48' and the patterned titanium nitride layer 46'.

As is understood by a person skilled in the art, the preferred embodiment of the method of the present invention is illustrative of the present invention rather than limiting of the present invention. Revisions may be made to materials, structures and dimensions through which is practiced the preferred embodiment of the method of the present invention while still providing embodiments which are within the spirit and scope of the present invention, as defined by the appended claims.

What is claimed is:

1. A method for forming a patterned barrier layer upon an electrode contact comprising:

providing a silicon substrate layer having an electrode contact region formed within the silicon substrate layer;

forming over the silicon substrate layer a blanket titanium layer, the blanket titanium layer contacting the electrode contact region of the silicon substrate layer;

processing thermally the blanket titanium layer in a nitrogen containing atmosphere to form a titanium silicide layer in contact with the electrode contact region and a blanket titanium nitride layer formed thereover, where the blanket titanium layer is completely consumed in forming the titanium silicide layer and the blanket titanium nitride layer;

forming upon the blanket titanium nitride layer a blanket barrier layer;

forming over the blanket barrier layer a patterned photoresist layer formed of a material which is susceptible to stripping within a photoresist stripper composition comprising a hydroxyl/amine compound;

etching, while employing the patterned photoresist layer as an etch mask layer, the blanket barrier layer to form a patterned barrier layer and the blanket titanium nitride layer to form a patterned titanium nitride layer; and stripping from the silicon substrate layer the patterned photoresist layer through use of the photoresist stripper composition comprising the hydroxyl/amine compound, where there is avoided delamination of the patterned barrier layer from the silicon substrate layer by completely consuming the blanket titanium layer when forming the titanium silicide layer and the blanket titanium nitride layer.

2. The method of claim 1 wherein the hydroxyl/amine compound is selected from the group consisting of hydroxylamine [(ie: $NH_2OH$; (HDA))] and [bis (2-aminoethoxy-2-ethanol) (ie: $(NH_2CH_2CH_2O)_2CHCH_2OH$; (DGA))]bis (2-aminoethoxy)2-ethanol.

3. The method of claim 1 wherein the thickness of the blanket titanium layer is from about 200 to about 1200 angstroms.

4. The method of claim 1 wherein the nitrogen containing atmosphere is selected from the group consisting of nitrogen atmospheres and ammonia atmospheres.

5. The method of claim 1 wherein the blanket barrier layer is selected from the group consisting of titanium-tungsten blanket barrier layers and titanium nitride blanket barrier layers.

6. A method for forming a patterned conductor metallization layer upon an electrode contact comprising:

providing a silicon substrate layer having an electrode contact region formed within the silicon substrate layer;

forming over the silicon substrate layer a blanket titanium layer, the blanket titanium layer contacting the electrode contact region of the silicon substrate layer;

processing thermally the blanket titanium layer in a nitrogen containing atmosphere to form a titanium silicide layer in contact with the electrode contact region and a blanket titanium nitride layer formed thereover, where the blanket titanium layer is completely consumed in forming the titanium silicide layer and the blanket titanium nitride layer;

forming upon the blanket titanium nitride layer a blanket barrier layer;

forming upon the blanket barrier layer a blanket conductor metal layer;

forming over the blanket conductor metal layer a patterned photoresist layer formed of a material which is susceptible to stripping within a photoresist stripper composition comprising a hydroxyl/amine compound;

etching while employing the patterned photoresist layer as an etch mask layer, the blanket conductor metal layer to form a patterned conductor metal layer, the blanket barrier layer to form a patterned barrier layer and the blanket titanium nitride layer to form a patterned titanium nitride layer; and stripping from the silicon substrate layer the patterned photoresist layer through use of the photoresist stripper composition comprising the hydroxylamine compound, where there is avoided delamination of the patterned barrier layer and the patterned conductor metal layer from the silicon substrate layer by completely consuming the blanket titanium layer when forming the titanium silicide layer and the blanket titanium nitride layer.

7. The method of claim 6 wherein the hydroxyl/amine compound is selected from the group consisting of hydroxylamine [(ie: $NH_2OH$; (HDA))] and [bis (2-aminoethoxy-2-ethanol) (ie: $(NH_2CH_2CH_2O)_2CHCH_2OH$; (DGA))]bis (2-aminoethoxy)-2-ethanol.

8. The method of claim 6 wherein the thickness of the blanket titanium layer is from about 200 to about 1200 angstroms.

9. The method of claim 6 wherein the nitrogen containing atmosphere is selected from the group consisting of nitrogen atmospheres and ammonia atmospheres.

10. The method of claim 6 wherein the blanket barrier layer is selected from the group consisting of titanium-tungsten alloy blanket barrier layers and titanium nitride blanket barrier layers.

11. The method of claim 6 wherein the blanket conductor metal layer is selected from the group consisting of aluminum containing blanket conductor metal layers and copper containing blanket conductor metal layers.

12. A method for forming a patterned barrier layer upon a pair of electrode contacts comprising:

providing a substrate;

forming over the substrate:
a monocrystalline silicon layer having a first electrode contact region formed within the monocrystalline silicon layer; and
a polycrystalline silicon layer having a second electrode contact region formed within the polycrystalline silicon layer;

forming over the substrate a blanket titanium layer, the blanket titanium layer contacting the first electrode contact region and the second electrode contact region;

processing thermally the blanket titanium layer in a nitrogen containing atmosphere to form a first titanium silicide layer in contact with the first electrode contact region, a second titanium silicide layer in contact with the second electrode contact region and a blanket titanium nitride layer covering both the first titanium silicide layer and the second titanium silicide layer, where the blanket titanium layer is completely consumed in forming the first titanium silicide layer, the second titanium silicide layer and the blanket titanium nitride layer;

forming upon the blanket titanium nitride layer a blanket barrier layer:

forming over the blanket barrier layer a patterned photoresist layer formed of a material which is susceptible to stripping with a photoresist stripper composition comprising a hydroxyl/amine compound;

etching, while employing the patterned photoresist layer as an etch mask layer:
the blanket barrier layer to form a patterned barrier layer covering both the first electrode contact region and the second electrode contact region; and
the blanket titanium nitride layer to form a co-extensive patterned titanium nitride layer covering both the first electrode contact region and the second electrode contact region; and stripping from the substrate the patterned photoresist layer through use of the photoresist stripper composition comprising the hydroxyl/amine compound, where there is avoided delamination of the patterned barrier layer from the substrate at the location of both the first electrode contact region and the second electrode contact region by completely consuming the blanket titanium layer when forming the first titanium silicide layer, the second titanium silicide layer and the blanket titanium nitride layer.

* * * * *